(12) United States Patent
Minami

(10) Patent No.: US 6,985,055 B2
(45) Date of Patent: Jan. 10, 2006

(54) TRANSMISSION LINE COMPRISED OF INTERCONNECTED PARALLEL LINE SEGMENTS

(75) Inventor: Fumihiro Minami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 10/403,007

(22) Filed: Apr. 1, 2003

(65) Prior Publication Data

US 2004/0090282 A1 May 13, 2004

(30) Foreign Application Priority Data

Nov. 7, 2002 (JP) .......................... P2002-324021

(51) Int. Cl.
*H01P 3/08* (2006.01)

(52) U.S. Cl. .......................................... 333/238; 333/1

(58) Field of Classification Search .................. 333/1, 333/238
See application file for complete search history.

(56) References Cited

U.S. PATENT DOCUMENTS 3,846,721 A * 11/1974 Fritz et al. ...................... 333/26
5,922,650 A * 7/1999 Ye .............................. 505/210

FOREIGN PATENT DOCUMENTS

| JP | 5-22001 | 1/1993 |
| JP | 7-25601 | 5/1995 |
| JP | 7-135407 | 5/1995 |
| JP | 10-229130 | 8/1998 |
| JP | 11-282592 | 10/1999 |
| JP | 2001-94011 | 4/2001 |

OTHER PUBLICATIONS

Fujio Ishihara, et al., "Clock Design of 300 MHZ 128-BIT 2-Way Superscalar Microprocessor", Proceedings of ASP-DAC, 2000, 4 Pages.
Masayuki Mizuno, et al., "On-Chip Multi-GHZ Clocking With Transmission Lines", IEEE ISSCC, 2000, pp. 366-367.

* cited by examiner

*Primary Examiner*—Benny Lee
(74) *Attorney, Agent, or Firm*—Oblon, Spivak, McClelland, Maier & Neustadt, P.C.

(57) ABSTRACT

A transmission line, includes: a first input electrode located in a first level; a plurality of parallel stripe-shaped signal lines in the first level, one end of the signal lines connected to the first input electrode; a first output electrode connected to another end of the signal lines, facing to the first input electrode; a second input electrode adjacent to the first input electrode in a second level facing the first level; a plurality of stripe-shaped ground lines positioned alternately in between and at outer sides of each of the signal lines in the first level, one end of the ground lines connected to the second input electrode; and a second output electrode adjacent to the first output electrode in the second level and connected to another end of the ground lines.

2 Claims, 6 Drawing Sheets

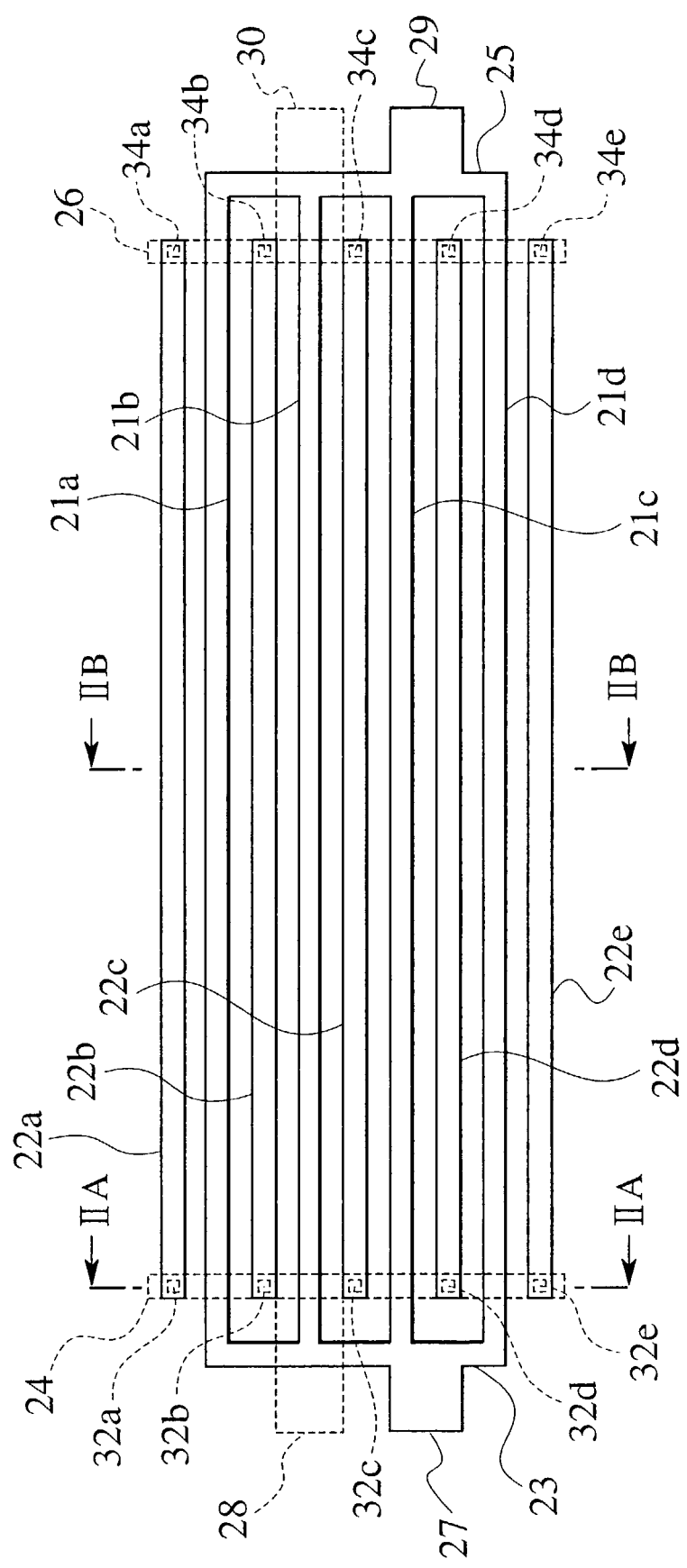

TRANSMISSION LINE COMPRISED OF INTERCONNECTED PARALLEL LINE SEGMENTS

CROSS REFERENCE TO RELATED APPLICATIONS

This application is based upon and claims the benefit of priority from prior Japanese Patent Application P2002-324021 filed on Nov. 7, 2002; the entire contents of which are incorporated by reference herein.

BACKGROUND OF THE INVENTION

1. Field of the Invention

The present invention relates to a transmission line for high-speed signals in semiconductor integrated circuits, and a semiconductor device using the same.

2. Description of the Related Art

In recent years, speeds of semiconductor integrated circuits have been increasing, whereby microprocessors that operate at a clock speed of several GHz and high frequency circuits operating at several GHz have been achieved. The prevention of a cross talk between signal lines and attention for a high frequency signal response including line inductance are necessary for transmitting signals in a semiconductor integrated circuit at a GHz level. A coplanar waveguide or a microstrip line is a representative transmission line for transmitting high frequency signals.

An example of applying the coplanar waveguide to a clock line in a semiconductor integrated circuit has been reported (see F. Ishihara, Proceedings of ASP-DAC2000, pp. 647–652, 2000).

Furthermore, the microstrip line is generally applied to a printed board and the like. There is also an example of a structure of the microstrip line for reducing parasitic capacitance in a semiconductor integrated circuit (see M. Mizuno, IEEE ISSCC 2000, pp. 366–367, 2002).

A line width may be increased in order to decrease the line impedance for ultra high-speed signal transmission. However, by increasing the line width, a coupling effect between signal lines in the upper and lower layers relatively increases, and an effect of cross talk noise becomes a problem. Furthermore, an error may increase in the line impedance of additional signal lines predicted prior to wiring processing.

In the microstrip line, a ground plane that forms a return path requires a large amount of wiring resources, and may be a large obstacle for general signal lines.

SUMMARY OF THE INVENTION

A first aspect of the present invention lies in a transmission line, and includes: a first input electrode located in a first level; a plurality of parallel stripe-shaped signal lines in the first level, one end of the signal lines connected to the first input electrode; a first output electrode connected to another end of the signal lines, facing to the first input electrode; a second input electrode adjacent to the first input electrode in a second level facing the first level; a plurality of stripe-shaped ground lines positioned alternately in between and at outer sides of each of the signal lines in the first level, one end of the ground lines connected to the second input electrode; and a second output electrode adjacent to the first output electrode in the second level and connected to another end of the ground lines.

A second aspect of the present invention lies in a transmission line, and includes: a first signal line located in a first level; a first ground line located in a second level facing the first level, the first ground line parallel to and facing the first signal line, and having a separated section at least at one portion; and bridge ground lines located in the first level on both sides of the first signal line overlaying the separated section, and connected respectively to one separated end and another separated end of the first ground line.

A third aspect of the present invention lies in a semiconductor device, and includes: a route line having a first microstrip line configuration, being connecting a route driver cell to a route relay buffer cell, the route driver cell receiving signals to be supplied to a terminal circuit; a route branch line having a second microstrip line configuration, being branched from the route relay buffer cell and connected to a first relay buffer cell; and a relay branch line having a coplanar waveguide configuration, being branched from the first relay buffer cell and connected to a second relay buffer cell for supplying the signals to the circuit.

BRIEF DESCRIPTION OF DRAWINGS

FIG. 1 is a schematic diagram of a coplanar waveguide according to a first embodiment of the present invention;

DETAILED DESCRIPTION OF THE INVENTION

Figure 2A:
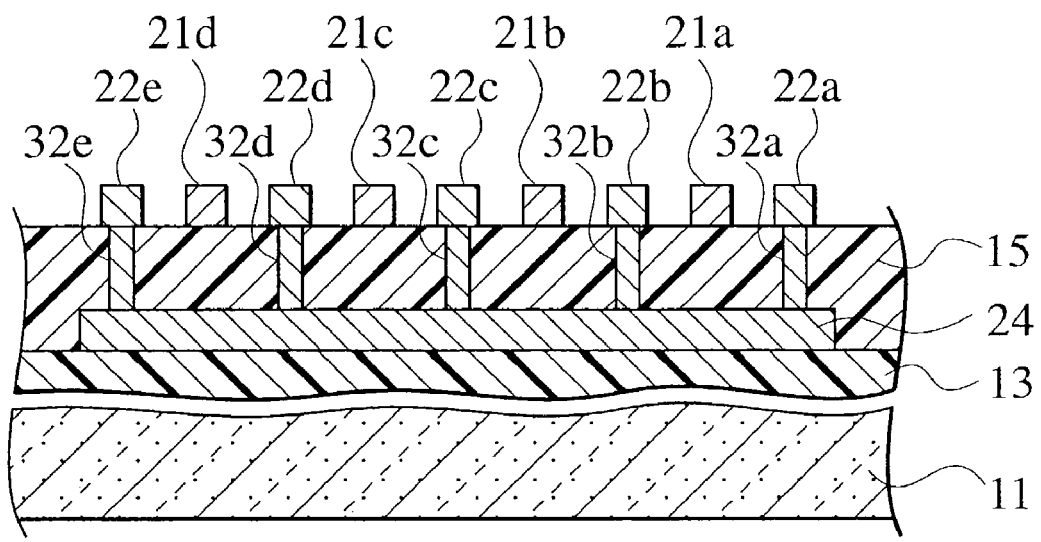
FIGS. 2A and 2B are cross-sections of the coplanar waveguide according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

A coplanar waveguide according to a first embodiment of the present invention, as shown in FIG. 1, has a plurality of stripe-shaped signal lines 21a, 21b, 21c, 21d, located in parallel between a plurality of stripe-shaped ground lines 22a, 22b, 22c, 22d, 22e in a first level. The signal lines 21a, 21b, 21c, 21d are, for example, connected at one end to a first input electrode 23 on the left-hand side facing the page of FIG. 1 and connected at another end to a first output electrode 25 on the right-hand side facing the page in the first level. The ground lines 22a, 22b, 22c, 22d, 22e are connected at one end to a second input electrode 24, which is positioned adjacent to the first input electrode 23, and at another end to a second output electrode 26, which is positioned adjacent to the first output electrode 25, and in contact with first plugs 32a, 32b, 32c, 32d, 32e and second plugs 34a, 34b, 34c, 34d 34e, respectively, in a second level that faces the first level where the signal lines 21a, 21b, 21c, 21d and ground lines 22a, 22b, 22c, 22d, 22e are positioned. Furthermore, first and second input terminals 27 and 28 are provided to the first and second input electrodes 23 and 24, respectively; and first and second output terminals 29 and 30 are provided to the first and second output electrodes 25 and 26, respectively. The first and second input terminals 27 and 28 are connected to a circuit on a signal transmission side; and the first and second output terminals 29 and 30 are connected to a circuit on a signal reception side.

Figure 2B:
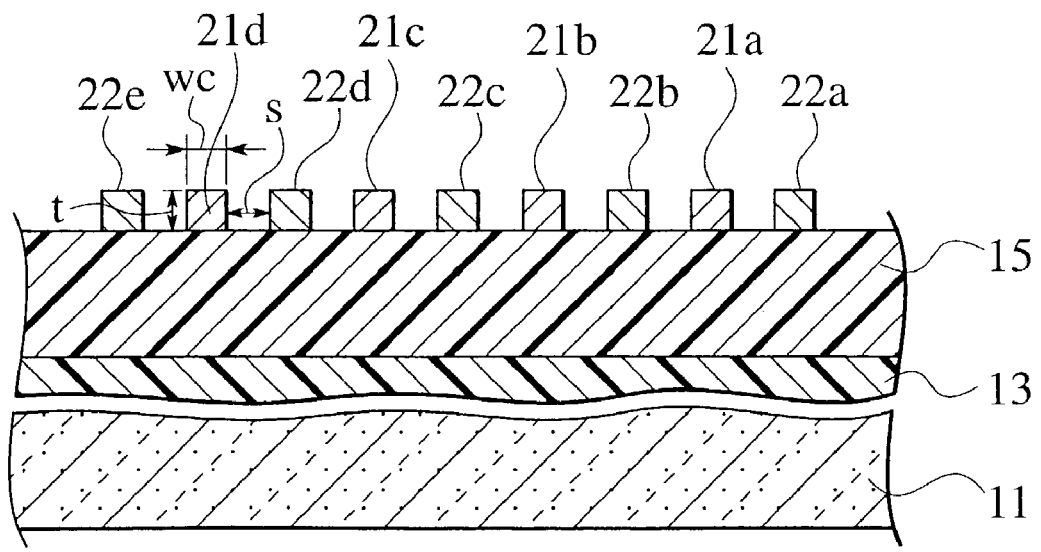

The structure of the coplanar waveguide according to the first embodiment of the present invention is described using FIGS. 2A and 2B, which are cross-sections cut along the lines IIA—IIA and IIB—IIB in FIG. 1, respectively. For convenience of description, a second interlayer insulating film 15 is shown as the uppermost layer of multi-level interlayer insulating films provided on a semiconductor substrate 11 as shown in FIGS. 2A and 2B, however, interlayer insulating films may be further provided on the second interlayer insulating film 15. Furthermore, the second input electrode 24 and second output electrode 26 are provided on a surface of a first interlayer insulating film 13, which is an underlying layer adjacent to the second interlayer insulating film 15. Needless to say, however, the second input electrode 24 (FIG. 2A) and second output electrode 26 (not shown in FIG. 2A) may be provided on a surface of another interlayer insulating film further underlying the first interlayer insulating film 13, or the second input electrode 24 and second output electrode 26 may be provided on a surface of an interlayer insulating film provided on an upper layer of the second interlayer insulating film 15.

As shown in FIG. 2B, the plurality of signal lines 21a, 21b, 21c, 21d of a line width wc and a line thickness t are alternately disposed with the ground lines 22a, 22b, 22c, 22d, 22e at intervals of a gap width s on a surface of the second interlayer insulating film 15 that is deposited on the first interlayer insulating film 13. The insulating films may be a silicon oxide ($SiO_2$) film and the like on the semiconductor substrate 11. The signal lines 21a, 21b, 21c, 21d are connected to the first input electrode 23 and first output electrode 25 at the surface of the second interlayer insulating film 15. On the other hand, the ground lines 22a, 22b, 22c, 22d, 22e are connected to the second input electrode 24 and second output electrode 26, which are provided on another surface that faces the surface of the second interlayer insulating film 15 such as the first interlayer insulating film 13, so as to avoid a short circuit with the signal lines 21a, 21b, 21c, 21d. For example, as shown in FIG. 2A, the ground lines 22a, 22b, 22c, 22d, 22e are connected to the second input electrode 24, which is disposed on the surface of the first interlayer insulating film 13, via the first plugs 32a, 32b, 32c, 32d, 32e that are buried in contact holes provided in the second interlayer insulating film 15.

In the coplanar waveguide according to the first embodiment of the present invention, the electromagnetic coupling between the parallel signal lines 21a, 21b, 21c, 21d and ground lines 22a, 22b, 22c, 22d, 22e becomes relatively stronger. Accordingly, it is possible to provide a coplanar waveguide which is substantially unaffected by noise due to cross talk from wiring layers underlying the second interlayer insulating film 15 or wiring layers deposited on the second interlayer insulating film 15. Furthermore, in a coplanar waveguide having three coplanar conductors, a current flows mostly near a surface in each of the coplanar conductors due to a skin effect in a high frequency region and the line resistance exponentially may increase. However, in the coplanar waveguide according to the first embodiment of the present invention, since the signal lines 21a, 21b, 21c, 21d and ground lines 22a, 22b, 22c, 22d, 22e are divided into a plurality of parallel transmission lines, increases in line resistance may be avoided. Furthermore, in order to make the most use of the advantages of the coplanar waveguide according to the first embodiment of the present invention and to save as much wiring resources as possible, for the line thickness t of the signal lines 21a, 21b, 21c, 21d, the line width wc of the signal lines 21a, 21b, 21c, 21d and the ground lines 22a, 22b, 22c, 22d, 22e may be less than twice the line thickness t, and the gap width s less than the line thickness t.

Second Embodiment

Figure 3:
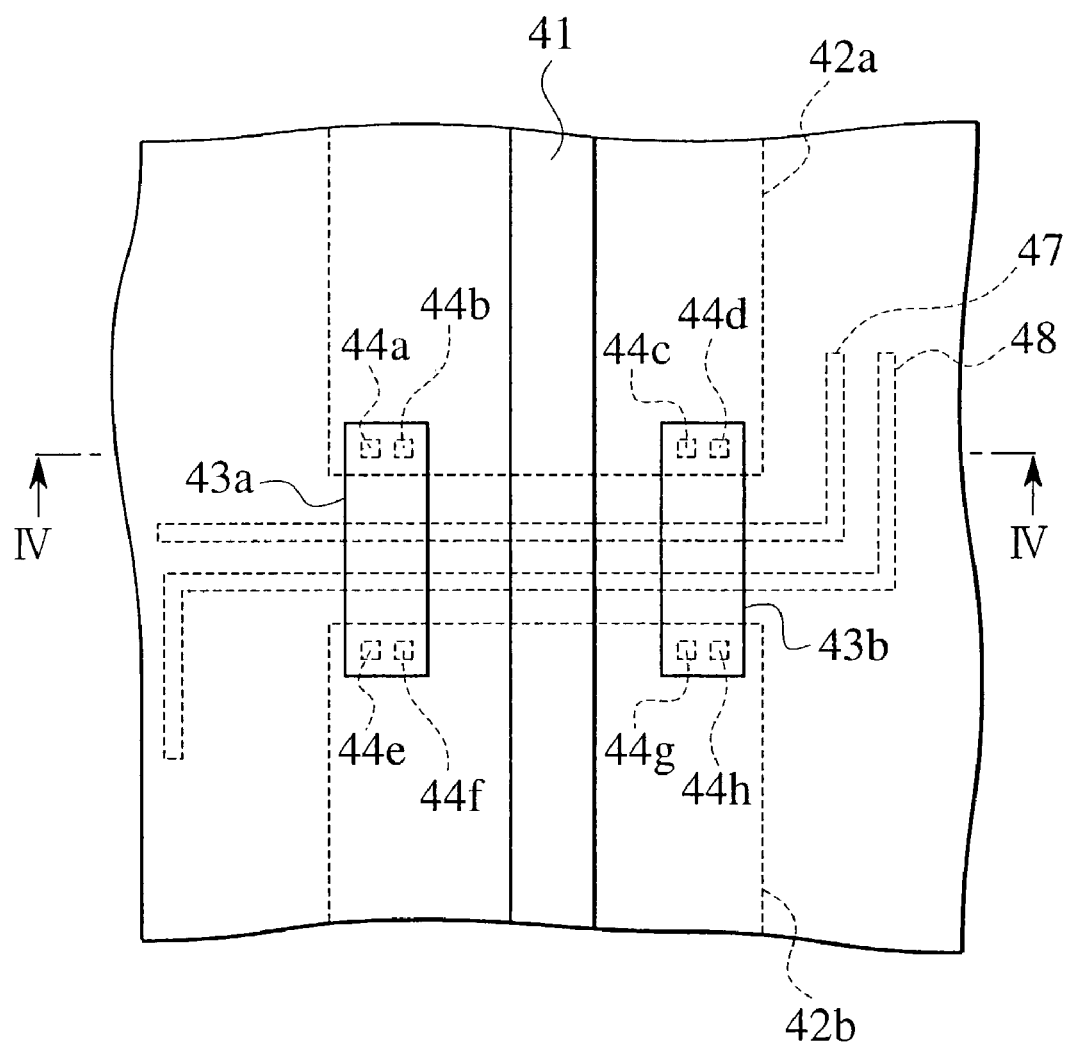
FIG. 3 is a schematic diagram of a microstrip line according to a second embodiment of the present invention.

As shown in FIG. 3, a microstrip line according to a second embodiment of the present invention has a first signal line 41 located in a first level and separated first ground lines 42a and 42b located in a second level which faces the first level. In the first level, bridge ground lines 43a and 43b, which are provided on both sides of the first signal line 41, are located such that portions of the bridge ground lines 43a and 43b face and overlap the first ground lines 42a and 42b. The bridge ground line 43a is connected to the first ground lines 42a and 42b via contact with plugs 44a, 44b and plugs 44e, 44f respectively, which are provided at portions of the integrated circuit that face and overlap the first ground lines 42a and 42b. The bridge ground line 43b is connected to the first ground lines 42a and 42b via contact with plugs 44c, 44d and plugs 44g, 44h respectively, which are provided at portions of the integrated circuit that face and overlap the first ground lines 42a and 42b. Accordingly, a first signal line 47, a second signal line 48 and the like can be located between the first ground lines 42a and 42b lying under the bridge ground lines 43a and 43b.

Figure 4:
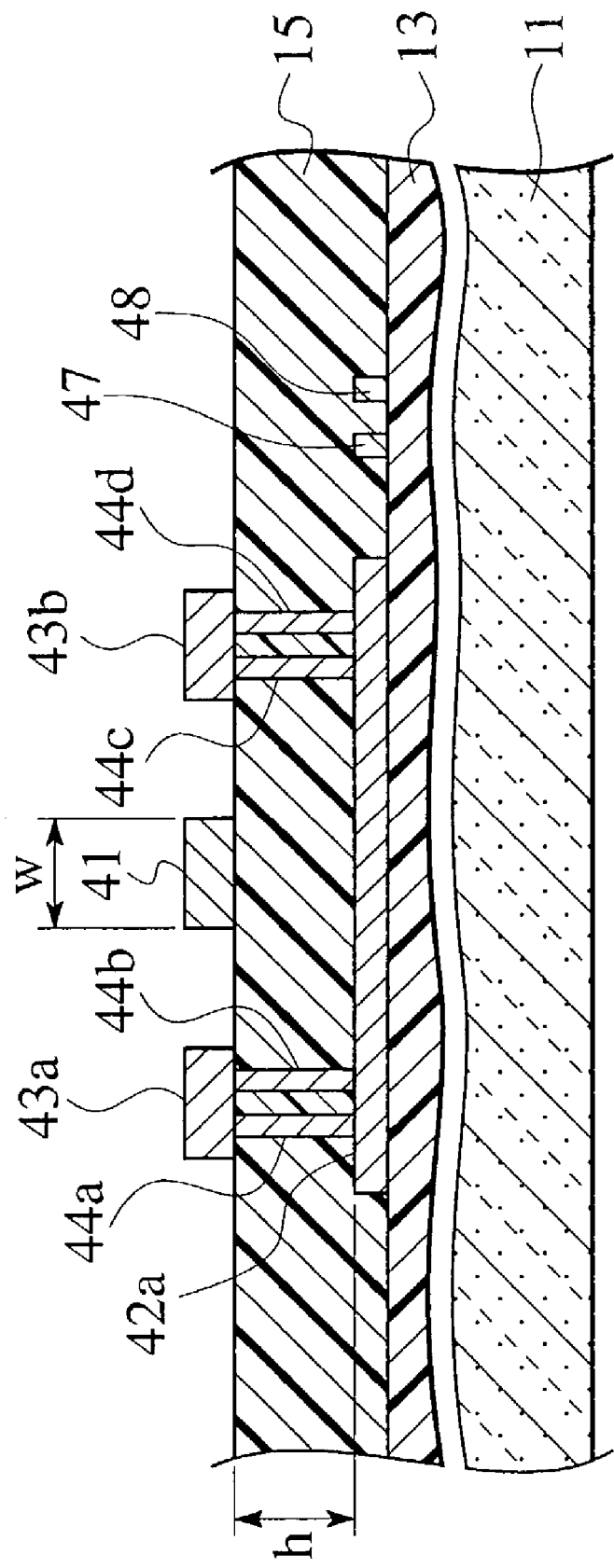
FIG. 4 is a cross-section of the microstrip line according to the second embodiment of the present invention.

The structure of the microstrip line according to the second embodiment of the present invention is described using FIG. 4, which is a cross-section cut along the line of IV—IV in FIG. 3. For convenience of description, a second interlayer insulating film 15 is shown as the uppermost layer of a plurality of interlayer insulating films provided on a semiconductor substrate 11 as shown in FIG. 4. Needless to say, however, interlayer insulating films may be further provided on the second interlayer insulating film 15.

As shown in FIG. 4, the first signal line 41 of a line width w and the bridge ground lines 43a and 43b on both sides thereof are located on a surface of the second interlayer insulating film 15, which is deposited on the first interlayer insulating film 13 above the semiconductor substrate 11. The bridge ground lines 43a and 43b are connected to the first ground line 42a, which is provided on the first interlayer insulating film 13, in contact with the plugs 44a, 44b and the plugs 44c, 44d respectively, which are buried in contact holes provided in the second interlayer insulating film 15. The first signal line 41 is separated from the first ground line 42a by an interlayer distance h. Furthermore, the first and second signal lines 47 and 48 are provided on the surface of the first interlayer insulating film 13.

With the microstrip line according to the second embodiment of the present invention, the separated first ground lines 42a and 42b, which face the first signal line 41 extending along the surface of the second interlayer insulating film 15, are connected by the bridge ground lines 43a and 43b, which are located on the same surface of the second interlayer insulating film 15 as the first signal line 41. Accordingly, it is possible to connect circuits, which are disposed on both sides of the first ground lines 42a and 42b, by the first and second signal lines 47 and 48 with a shorter distance across the first ground lines 42a and 42b without detouring. It should be noted that the first signal line 41 and the bridge ground lines 43a and 43b provide a coplanar waveguide having a 3-strip structure.

The first ground lines 42a and 42b are used as grounds for the microstrip line according to the second embodiment of the present invention instead of the ground planes generally used for microstrip lines. The line width of the first ground lines 42a and 42b is greater than or equal to the line width w of the first signal line 41, and less than a value of (w+20*h). The line width of the first ground lines 42a and 42b is set so as to assure a return current of approximately 75% to 95% for the microstrip line. Thus, fluctuations in electrical characteristics such as impedance of a transmission line are kept within 10% of the characteristic impedance, allowing for the saving of wiring resources. Furthermore, when a total length of connecting sections with the bridge ground lines 43a and 43b is less than 20% of the length of the first ground lines 42a and 42b, it is possible to control fluctuations in the characteristic impedance along the length of the transmission line within ±5%.

An example where the first ground lines 42a and 42b underlie the first signal line 41 has been illustrated in the second embodiment of the present invention. However, a first ground line may be in an upper layer, or a microstrip line may alternatively be sandwiched by the first ground lines in both the upper and lower layers.

Third Embodiment

A transmission line used in a semiconductor device according to a third embodiment of the present invention is characterized by using in combination a coplanar waveguide and a microstrip line described in the first and second embodiments. Since other elements are the same as in the first and second embodiments, duplicate descriptions are omitted.

Figure 5:
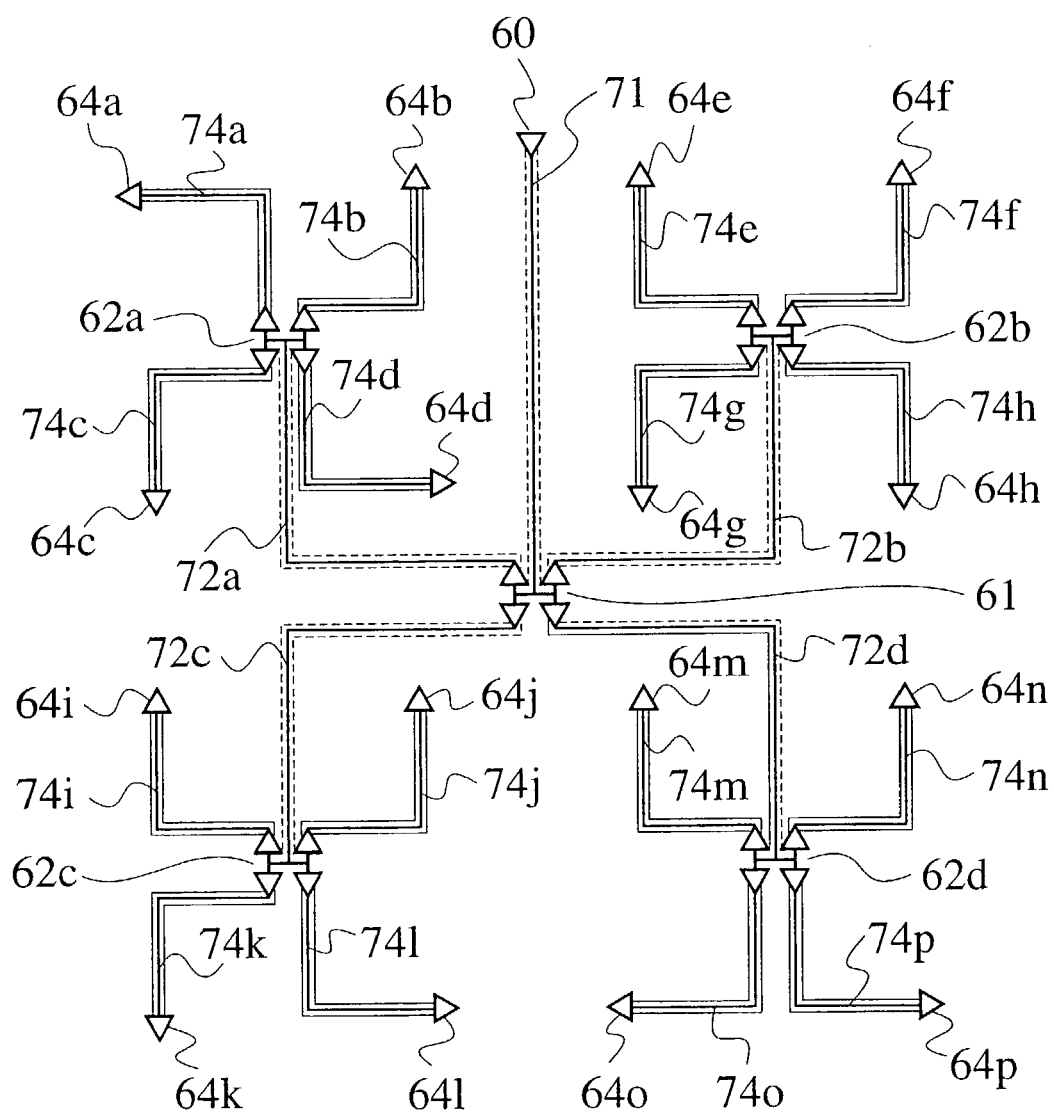
FIG. 5 is a schematic diagram describing a transmission line in a semiconductor device according to a third embodiment of the present invention.

As shown in FIG. 5, the transmission line used in the semiconductor device according to the third embodiment of the present invention is, for example, applied for clock signal lines in a logic circuit and the like. To begin with, a clock signal is provided to a route driver cell 60 from a clock signal source, and relayed to a route relay buffer cell 61 from a route line 71, which is a first microstrip line. The clock signal is further propagated from the route relay buffer cell 61 to first relay buffer cells 62a, 62b, 62c, 62d from route branch lines 72a, 72b, 72c, 72d, which are second microstrip lines. The branched clock signals are then further propagated from each of the first relay buffer cells 62a, 62b, 62c, 62d to each of second relay buffer cells 64a, 64b, 64c, 64d, 64e, 64f, 64g, 64h, 64i, 64j, 64k, 64l, 64m, 64n, 64o, 64p from relay buffer branch lines 74a, 74b, 74c, 74d, 74e, 74f, 74g, 74h, 74i, 74j, 74k, 74l, 74m, 74n, 74o, 74p, which are coplanar waveguides.

When supplying a signal to many destinations, such as the clock signal lines in a logic circuit and the like, buffer cells for relaying are inserted along the clock signal line so as to distribute the clock signal. The coplanar waveguide according to the first embodiment of the present invention employs a structure of the signal lines and ground lines that are separated in thin lines and positioned in parallel, thus a parasitic capacitance increases and a line resistance also easily increases. Accordingly, the microstrip line according to the second embodiment of the present invention is advantageous to send high-speed clock signals on a GHz level. However, the wiring resources cannot be sufficiently acquired when the microstrip lines are heavily used.

Figure 6:
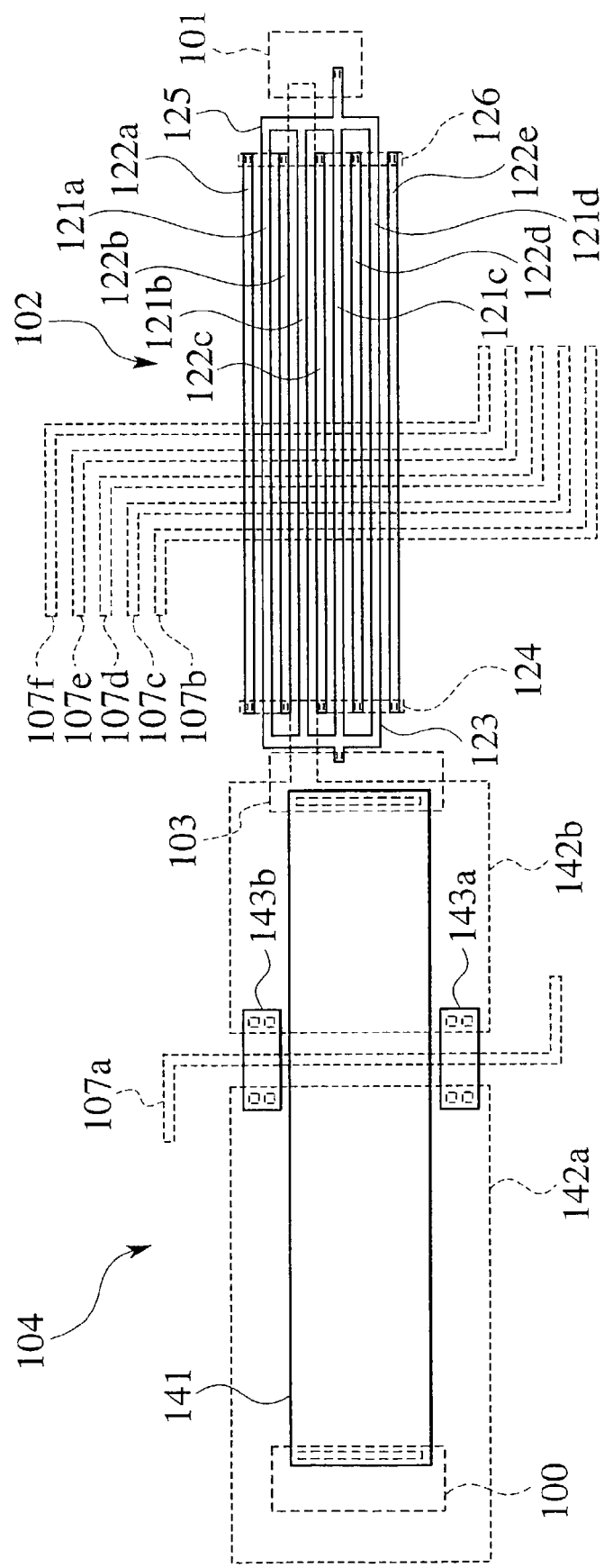
FIG. 6 is a schematic diagram illustrating an example of the transmission line in the semiconductor device according to the third embodiment of the present invention.

In the semiconductor device according to the third embodiment of the present invention, as shown in FIG. 6 for example, a microstrip line 104 is used in the region near the clock signal source where a signal line 107a is sparsely located. On the other hand, a coplanar waveguide 102 is used in the region where signal lines 107b, 107c, 107d, 107e, 107f are highly dense at the clock signal supply destination. The micro strip line 104 has a clock input buffer cell 100, which provides the clock signal to one end of a first signal line 141 in a first level. First ground lines 142a and 142b, which are located in a second level that faces the first level, in which the first signal line 141 is located, are separated, and bridge ground lines 143a and 143b are provided on the first level. The signal line 107a is located under the bridge ground lines 143a and 143b.

Another end of the first signal line 141 is connected to a first input electrode 123 of the coplanar waveguide 102 through contact with a relay buffer cell 103. Furthermore, the first ground line 142b is connected to a second input electrode 124. Second signal lines 121a, 121a, 121b, 121c, 121d and second ground lines 122a, 122b, 122c, 122d, 122e of the coplanar waveguide 102 are formed on the first level. Accordingly, multiple signal interconnects 107b, 107c, 107d, 107e, 107f may be positioned under the coplanar waveguide 102. The second signal lines 121a, 121b, 121c, 121d and second ground lines 122a, 122b, 122c, 122d, 122e are connected at another end on the opposite side of the microstrip line 104 to a first output electrode 125 and a second output electrode 126. The first output electrode 125 is further connected to a clock output buffer cell 101, supplying the clock signal to other, nearby circuits.

According to the transmission lines of the semiconductor device of the third embodiment of the present invention, deterioration of signal propagation characteristics may be reduced and the wiring resource consumption may be reduced. Here, when the characteristic impedance and the line resistance per unit length of the coplanar waveguide according to the first embodiment are respectively designated as Zc and Ro, the length of the coplanar waveguide may be determined so as to be less than a value of (2*Zc/Ro). The signals to be propagated may drastically attenuate, when the length of the coplanar waveguide become longer than the value of (2*Zc/Ro).

Other Embodiments

The present invention has been described as discussed above, however the descriptions and drawings that constitute a portion of this disclosure should not be perceived as limiting this invention. Various alternative embodiments and operational techniques will become clear to persons skilled in the art from this disclosure In the first through third embodiments of the present invention, an insulating film such as $SiO_2$ and the like has been illustrated as the first and the second interlayer insulating films 13, 15. However, an insulating film such as a silicon nitride ($Si_3N_4$) film or an alumina ($Al_2O_3$) film, for example, may be used. Additionally, even with interlayer insulating films having an wiring structure including electrical conducting layers such as polysilicon films, amorphous silicon films, metal films or the like, the same results may be achieved.

Furthermore, the coplanar waveguide according to the first embodiment of the present invention may be applied to a differential signal line. Namely, a pulse signal is provided to one end of the coplanar waveguide, while a differential pulse signal is provided to another end. Since the pulse signals of opposite polarity are transmitted among adjacent lines, electromagnetic coupling is relatively strengthened, making it more difficult to be affected by a noise due to cross talk from other wiring layers.

What is claimed is:

1. A transmission line, comprising:
    a first input electrode located in a first level;
    a plurality of parallel stripe-shaped signal lines positioned in the first level, one end of the signal lines connected to the first input electrode;
    a first output electrode connected to an opposite end of the signal lines from the first input electrode;
    a second input electrode adjacent to the first input electrode in a second level facing the first level;
    a plurality of stripe-shaped ground lines positioned in the first level, the ground lines located alternately in between and at outer sides of each of the signal lines in the first level, one end of the ground lines connected to the second input electrode; and
    a second output electrode adjacent to the first output electrode in the second level and connected to another end of the ground lines.

2. The transmission line of claim 1, wherein line widths of the signal lines and the ground lines are respectively less than twice a line thickness of the signal lines, and gap widths between the signal lines and the ground lines are less than the line thickness of the signal lines.

* * * * *